United States Patent
Kwean

(10) Patent No.: US 7,054,220 B2
(45) Date of Patent: May 30, 2006

(54) MEMORY DEVICE HAVING REPEATERS

(75) Inventor: Ki Chang Kwean, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 29 days.

(21) Appl. No.: 10/746,032

(22) Filed: Dec. 24, 2003

(65) Prior Publication Data

US 2005/0013191 A1   Jan. 20, 2005

(30) Foreign Application Priority Data

Jul. 14, 2003   (KR) .................... 10-2003-0047744

(51) Int. Cl.
*G11C 8/00* (2006.01)

(52) U.S. Cl. .................... 365/230.08; 365/230.06; 365/230.03

(58) Field of Classification Search .......... 365/230.08, 365/230.06, 230.03, 189.05
See application file for complete search history.

(56) References Cited

U.S. PATENT DOCUMENTS

| 5,128,897 | A | * | 7/1992 | McClure | 365/230.06 |
| 5,237,536 | A | * | 8/1993 | Ohtsuki | 365/230.06 |
| 5,737,276 | A | * | 4/1998 | Shin et al. | 365/230.08 |

FOREIGN PATENT DOCUMENTS

JP   11 353870   12/1999

* cited by examiner

*Primary Examiner*—David Lam
(74) *Attorney, Agent, or Firm*—Ladas & Parry LLP

(57) ABSTRACT

Disclosed is a memory device having repeaters capable of preventing an expected signal delay and a signal distortion caused by a long transmission length of a long address signal and a long control signal. The memory device comprises: a plurality of banks; an address pad; an address driver for transmitting an address signal, which is inputted through the address pad, into each of the banks through address signal lines; a control pad; a control driver for transmitting a control signal, which is inputted through the control pad, into each of the banks through control signal lines; and repeaters arranged on the address signal lines and/or the control signal lines.

3 Claims, 4 Drawing Sheets

MEMORY DEVICE HAVING REPEATERS

BACKGROUND OF THE INVENTION

1. Field of the Invention

The present invention relates to a memory device having at least one repeater for address signals and control signals, and more particularly to a memory device having at least one repeater for preventing signal delay created when lengths of address signal lines and control signal lines become long.

2. Description of the Prior Art

In general, address signals and control signals applied to address pads and control pads are inputted into memory core blocks (banks) through address drivers and control drivers, respectively.

However, as the size of a semiconductor device becomes enlarged, it is necessary for the address signals and control signals to be transmitted faraway. Herein, the control signals includes row address control signals, column address control signals, and bank control signals used in a memory device. The address signals includes row addresses and column addresses.

FIG. 1 is a view for explaining the routing of address signals and control signals according to the prior art.

As shown in FIG. 1, address signals and control signals are outputted from drivers adjacent to pads so as to be transmitted into memory core blocks (i.e., banks). As the size of the semiconductor chip becomes larger, the signals must be transmitted farther. Such a long transmission length increases resistance component and capacitance component of signal lines, thereby delaying the time for a signal transmission. Also, a long signal line may distort a signal due to a crosstalk with adjacent signals. Such distortion of the signal may cause an unexpected timing delay. The unexpected timing delay may reduce a timing margin with respect to other control signals, thereby resulting fail of chips.

Also, if an exact timing control for a near-side bank and a far-side bank is not performed, the timing of a data signal outputted from a bank by means of a control signal is not exactly controlled. Therefore, a bank remote from a data pad outputs data too late, and a bank adjacent to the data pad outputs data too early. In this case, since the timing control for data output is not smoothly performed, erroneous data can be outputted through the data pad.

SUMMARY OF THE INVENTION

Accordingly, the present invention has been made to solve the above-mentioned problems occurring in the prior art, and an object of the present invention is to provide a memory device having repeaters capable of preventing an expected signal delay and a signal distortion caused by a long transmission length of a long address signal and a long control signal.

In order to accomplish this object, there is provided a memory device comprising: drivers for receiving signals applied from an exterior and transmitting the received signals to bank regions; signal lines connected between the drivers and the bank regions; and at least one repeater arranged on the signal lines.

In accordance with another aspect of the present invention, there is provided a memory device comprising: a plurality of banks; address pads; address drivers for transmitting address signals, which are inputted through the address pads, into each of the banks through address signal lines; control pads; control drivers for transmitting control signals, which are inputted through the control pads, into each of the banks through control signal lines; and repeaters arranged on the address signal lines.

Also, according to the present invention, the repeater can be additionally arranged on the control lines.

Also, according to the present invention, the repeater includes an inverter chain.

In addition, according to the present invention, the repeaters are selectively arranged in consideration of lengths of the address signal lines and the control signal lines.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
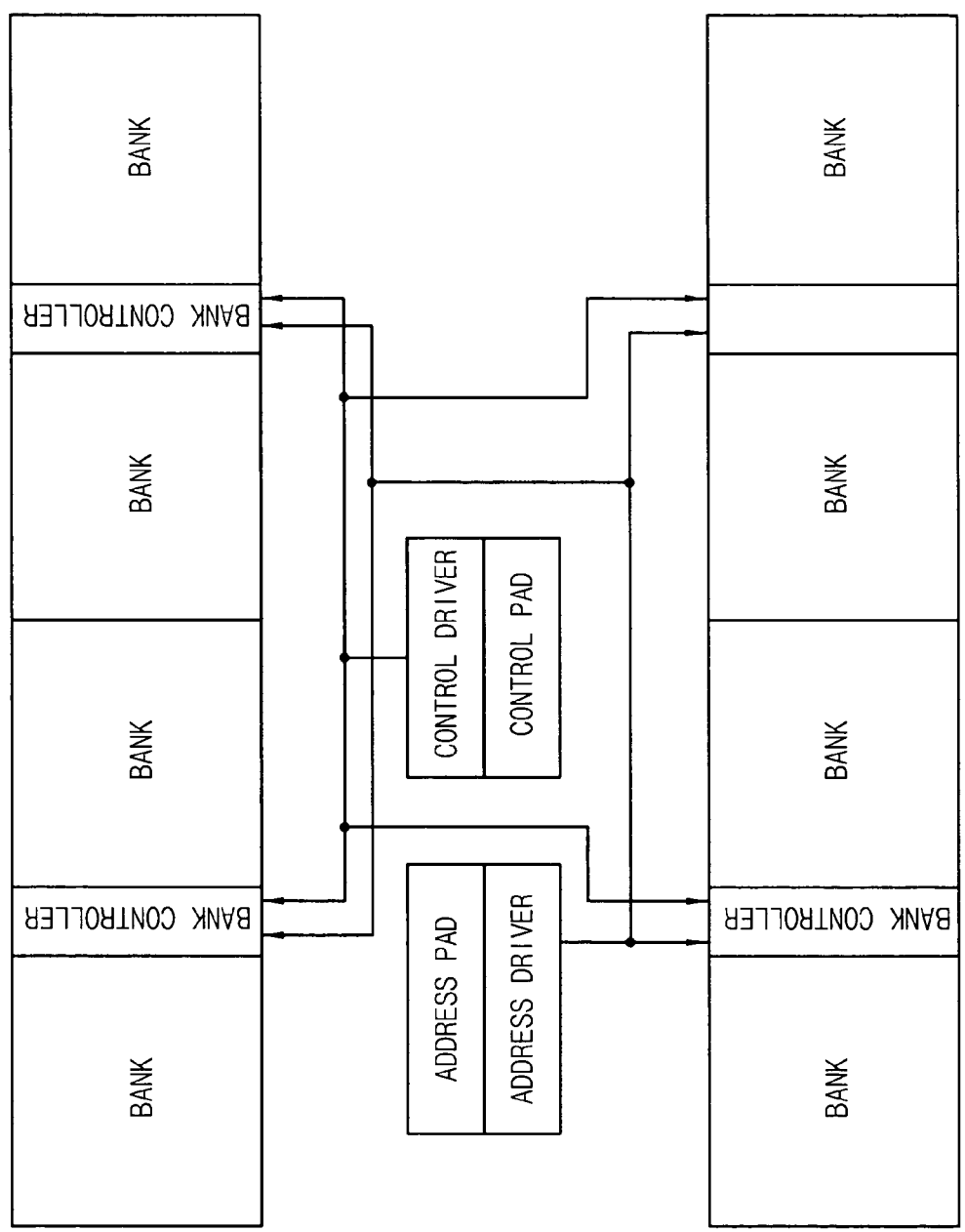
FIG. 1 is a view for explaining a routing of address signal lines and control signal lines according to the prior art.

Hereinafter, a preferred embodiment of the present invention will be described with reference to the accompanying drawings. In the following description and drawings, the same reference numerals are used to designate the same or similar components, and so repetition of the description on the same or similar components will be omitted.

According to the present invention, repeaters are provided for address signals and control signals. In addition, the repeaters are aligned for signals to be transmitted from address drivers and control drivers to far-side banks.

Figure 2:
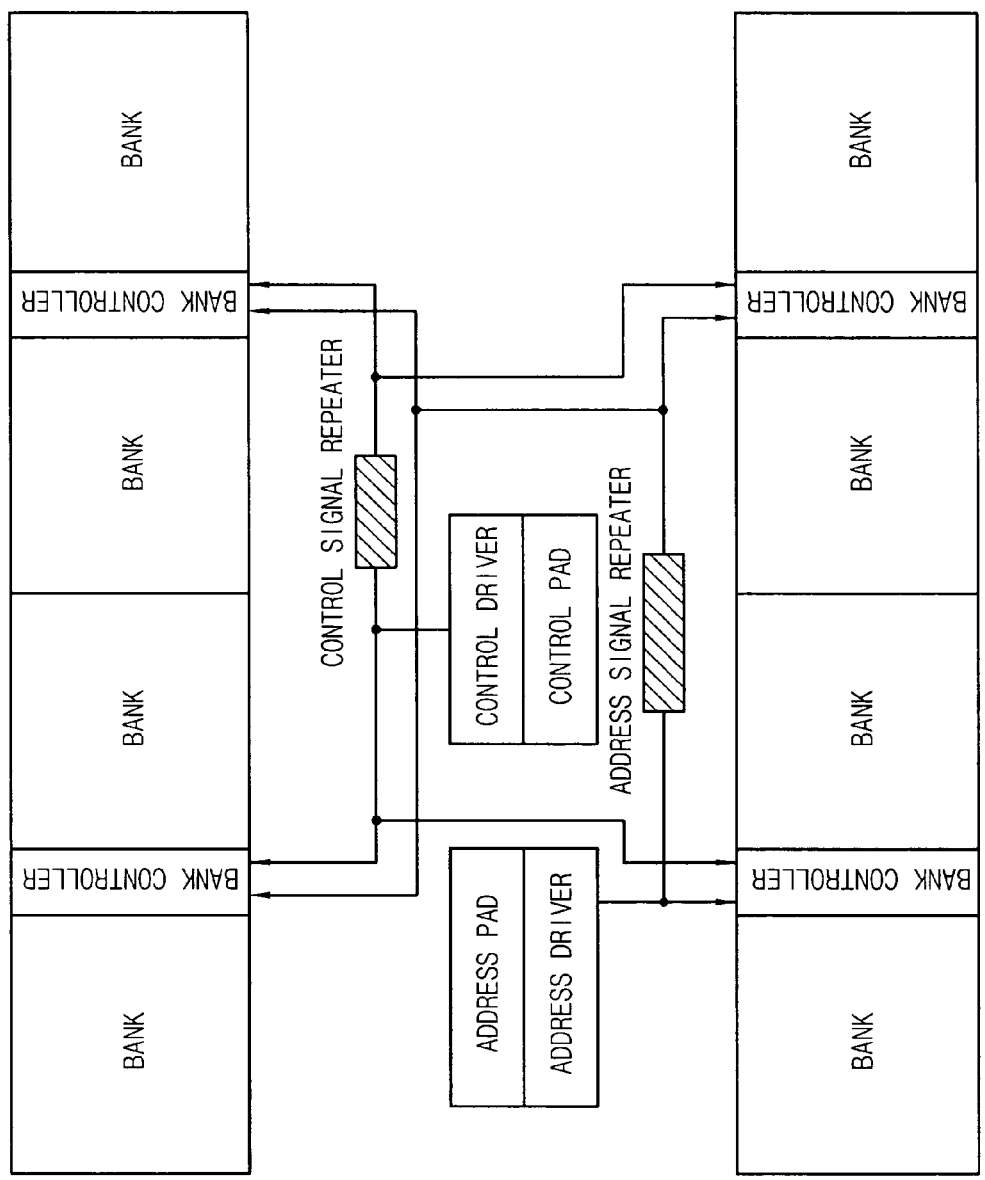
FIG. 2 is a view for explaining a routing of address signal lines and control signal lines and an arrangement of repeaters, after the repeaters according to the present invention are added to a memory device.

FIG. 2 shows an address signal repeater and a control signal repeater employed in the present invention.

As shown in FIG. 2, it is preferred that the address signal repeater and the control signal repeater are arranged only when a length of each signal line is long. In other words, when the length between a driver and a bank is short, a repeater may be not used. When the repeater is used, an actual transmission length, which is achieved by driving an address driver or a control driver, is identical to a length from each driver to the repeater. The repeater amplifies an address signal or a control signal transmitted through a signal line, and then transmits the amplified signal to banks. As a result, when a repeater is used, the transmission length of each driver becomes short, and also a resistance and a capacitance component of a transmission line are remarkably reduced. Due to the shortened transmission length, an affect of crosstalk is reduced. In addition, the shortened transmission length and the reduced crosstalk may improve a time delay and enable a signal to be safely transmitted regardless of changes in the circumstances.

Another effect of the repeater is that data outputted from banks can simultaneously arrive at a data pad by controlling each of a near-side bank and a far-side bank with different timing from each other, thereby easily performing data output timing control.

Figure 3:
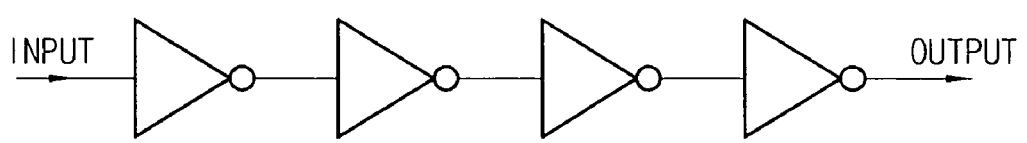
FIG. 3 is a circuit diagram of a repeater according to present invention.

FIG. 3 is a circuit diagram of a repeater including an inverter chain according to the present invention.

Referring to FIG. 3, an input node of the inverter chain consists of a first transistor having a small size. The size of transistors becomes enlarged in a rear direction of the inverter chain. Accordingly, the inverter chain has a small input capacitance and a large driving capability.

Figure 4:
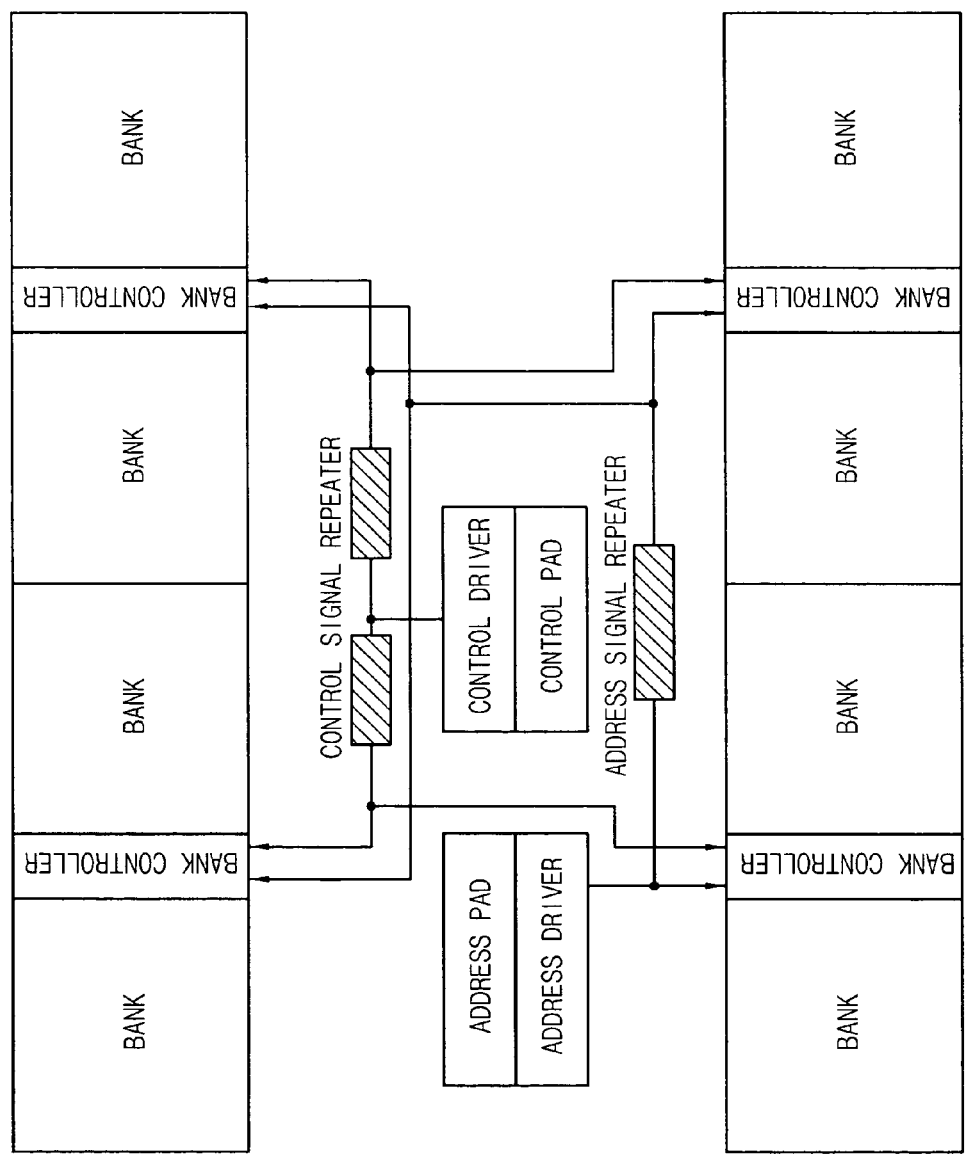
FIG. 4 is a view for explaining a routing of signal lines and an arrangement of repeaters, when the repeaters are simultaneously arranged on signal lines connected to near-side banks and far-side banks.

FIG. 4 is a view for explaining a routing of signal lines and the arrangement of repeaters, when the repeaters are arranged on signal lines connected to near-side banks and far-side banks.

As shown in FIG. 4, repeaters can be arranged on signal lines connected to near-side banks and far-side banks, respectively. As a result, a data output timing of banks can be more smoothly controlled, and also the length of a signal line, through which the driver transmits a signal, can be more shortened.

In the present invention, the repeater shown in FIG. 3 can be arranged on address signal lines and control signal lines, respectively, and also can be applied to all signal lines.

With the appropriate arrangement of repeaters according to the present invention, the timing of data outputted from banks can be controlled, so that data outputted from near-side banks and far-side banks can be controlled so as to simultaneously arrive at a data pad, thereby easily performing data output.

Also, the repeaters according to the present invention can be applied to all semiconductor devices as well as memory devices.

As described above, according to the present invention, the transmission length, which is achieved by driving an address driver or a control driver, is minimized, so that a capacitance and a resistance component of each transmission line are minimized. Also, since the influence of crosstalk is reduced, an unexpected timing error is prevented, so that a semiconductor device can be stably operated. Furthermore, since the timing of data outputted from banks can be controlled, data outputted from near-side banks and far-side banks can be controlled such that data simultaneously arrive at a data pad thereby easily performing data output.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device comprising:
a plurality of banks;
bank controllers each aligned between a pair of banks;
signal pads applied signals from an exterior of the memory device;
signal lines commonly connected with the bank controllers;
at least one repeater comprised of an inverter chain having N inverters arranged on the signal lines and connected in series where 'N' is an even number and the driving capability of the inverters is sequentially increased; and
drivers for receiving the signals applied from the signal pads, and transmitting the signals to at least one adjacent bank controller through the signal lines and to other far-side bank controllers through the signal lines and through the at least one repeater.

2. The memory device as claimed in claim 1, wherein the signal lines includes at least one address signal line and at least one control signal line.

3. A memory device comprising:
a plurality of banks;
bank controllers each aligned between a pair of banks;
control pads applied control signals from an exterior;
control signal lines commonly connected with the bank controllers;
at least one control signal repeater including a first inverter chain having N inverters arranged on the control signal lines and connected in series, wherein 'N' is an even number and driving capabilities of the inverters are sequentially increased;
control drivers for receiving the control signal applied from the control pads, and transmitting the control signal to at least one adjacent bank controller through the control signal lines and to other far-side bank controllers through the control signal lines and through the at least one control signal repeater;
address pads applied address signal from the exterior;
address signal lines commonly connected with the bank controllers;
at least one address signal repeater including a second inverter chain having N inverters arranged on the control signal lines and connected in series, wherein driving capabilities of the inverters are sequentially increased; and
address drivers for receiving the address signals applied from the address pads, and transmitting the address signals to at least one adjacent bank controller through the address signal lines and to other far-side bank controllers through the address signal lines and through the at least one address signal repeater.

* * * * *